United States Patent
Yung et al.

(10) Patent No.: US 8,026,748 B2
(45) Date of Patent: Sep. 27, 2011

(54) DLL CIRCUIT HAVING ACTIVATION POINTS

(75) Inventors: Won Joo Yung, Gyeonggi-do (KR); Hyun Woo Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 16 days.

(21) Appl. No.: 12/428,507

(22) Filed: Apr. 23, 2009

(65) Prior Publication Data

US 2010/0156486 A1    Jun. 24, 2010

(30) Foreign Application Priority Data

Dec. 23, 2008    (KR) .................. 10-2008-0132095

(51) Int. Cl.
   *H03L 7/06*    (2006.01)
(52) U.S. Cl. ........................ 327/158; 327/149
(58) Field of Classification Search .................. 327/149, 327/158
See application file for complete search history.

(56) References Cited

U.S. PATENT DOCUMENTS

| | | | |
|---|---|---|---|
| 6,242,954 B1 * | 6/2001 | Taniguchi et al. | 327/149 |
| 7,190,201 B2 | 3/2007 | Haerle et al. | |
| 7,443,216 B2 | 10/2008 | Gomm et al. | |
| 7,671,648 B2 * | 3/2010 | Kwak | 327/158 |
| 2008/0189568 A1 * | 8/2008 | Kwak | 713/501 |
| 2009/0146707 A1 * | 6/2009 | Shin | 327/158 |
| 2010/0134166 A1 * | 6/2010 | Kwak | 327/158 |

* cited by examiner

*Primary Examiner* — Lincoln Donovan
*Assistant Examiner* — Adam Houston
(74) *Attorney, Agent, or Firm* — Ladas & Parry LLP

(57) ABSTRACT

A delay locked loop (DLL) circuit includes a delay line configured to generate a delay clock signal by delaying a reference clock signal in response to a delay control signal, the delay line having two or more initial activation points, wherein the initial activation points are selected according to an initial value of the delay control signal; a delay compensating unit configured to generate a feedback clock signal by delaying the delay clock signal for a predetermined time; a phase detecting unit configured to generate a phase detection signal by comparing a phase of the reference clock signal to a phase of the feedback clock signal; and a delay control unit configured to generate the delay control signal in response to the phase detection signal.

9 Claims, 5 Drawing Sheets

DLL CIRCUIT HAVING ACTIVATION POINTS

CROSS-REFERENCES TO RELATED PATENT APPLICATION

The present application claims priority under 35 U.S.C 119(a) to Korean Application No. 10-2008-0132095, filed on Dec. 23, 2008, in the Korean Intellectual Property Office, which is incorporated herein by reference in its entirety as set forth in full.

BACKGROUND OF THE INVENTION

The present invention relates generally to semiconductor integrated circuits (IC) and, more particularly, to a delay locked loop (DLL) circuit included in a semiconductor IC.

A conventional semiconductor IC, such as synchronous dynamic random access memory (SDRAM), uses a clock signal to increase operational speed. For this, a semiconductor IC includes a clock buffer that buffers an externally input clock signal. In some cases, a semiconductor IC includes a delay locked loop (DLL) circuit or a phase locked loop (PLL) circuit to generate an internal clock signal in which the phase difference between the internal clock signal and the external clock signal has been corrected.

A DLL circuit delays a reference clock signal output from a clock input buffer using a delay line. A delay time, which is the delay of the reference clock signal by the delay line, is determined based on the result of a comparison between the phase of the reference clock signal and the phase of a feedback clock signal. The feedback clock signal is generated by delaying the output clock signal of the delay line by a delay value acquired by modeling the amount of delay occurring when the clock signal output from the delay line is transmitted to a data input/output buffer. To model this delay, a replica delayer is provided in the DLL circuit. With such a configuration, the DLL circuit outputs a clock signal having a phase that is earlier than that of the external clock signal by a predetermined time. Accordingly, the data input/output buffer can perform a buffering operation by using an internal clock signal whose timing coincides with the external clock signal.

FIG. 1 is a timing diagram shown for illustrating the operation of a known DLL circuit.

When referring to FIG. 1, it is possible to realize the phase relationship between a reference clock signal 'clk_ref' and a feedback clock signal during an initial operation of the DLL circuit. Herein, the feedback clock signal is represented as a first feedback clock signal 'clk_fb1' when the initial delay value of the delay line is at a minimum value; and the feedback clock signal is represented as a second feedback clock signal 'clk_fb2' when the delay line in an initial stage has a predetermined delay value. Generally, the delay line of the DLL circuit does not set the initial delay value to the minimum value. This purpose of this is to prevent a locking operation from being interrupted when the delay line must reduce the delay time after the initial operation. Typically, the initial delay value of the delay line of the DLL circuit is set to a delay amount that is half of the total delay amount of the delay line.

However, the second feedback clock signal 'clk_fb2' generated as a result of the predetermined initial delay value is also not synchronized with the first rising edge 'RE1' of the reference clock signal 'clk_ref'; and therefore, the second feedback clock signal 'clk_fb2' must be synchronized with a second rising edge 'RE2'. At this time, the total delay amount that the delay line must allocate to the reference clock signal 'clk_ref' for the locking operation exceeds one cycle of the reference clock signal 'clk_ref'. Thus, when the delay line is initially set to be delayed by the predetermined initial delay value, the delay line must have a total delay amount that is larger than one cycle of the reference clock signal 'clk_ref'. In actuality, the delay line is generally configured to have a total delay amount that is approximately two cycles against using a high-frequency clock signal.

Accordingly, the DLL circuit described above has limitations in that the length of the delay line increases. The length of the delay line has a problem not only in an area efficiency aspect, but also in that the length of the delay line causes an increase of an internal jitter component. Consequently, the operational stability of the above-described DLL circuit is reduced, thereby causing problems when attempting to realize high integration and increased speed of a semiconductor IC.

SUMMARY

Aspects of the present invention include a delay locked loop (DLL) circuit that can generate an internal clock signal more stably.

Further, aspects of the present invention include a DLL circuit that can increase an area margin.

In one aspect, a delay locked loop (DLL) circuit includes a delay line configured to generate a delay clock signal by delaying a reference clock signal in response to a delay control signal, the delay line having two or more initial activation points, wherein the initial activation points are selected according to an initial value of the delay control signal; a delay compensating unit configured to generate a feedback clock signal by delaying the delay clock signal for a predetermined time; a phase detecting unit configured to generate a phase detection signal by comparing a phase of the reference clock signal to a phase of the feedback clock signal; and a delay control unit configured to generate the delay control signal in response to the phase detection signal.

In another aspect, a delay locked loop (DLL) circuit comprises a delay line configured to generate a delay clock signal by delaying a reference clock signal in response to a single delay control signal and a dual delay control signal; a delay compensating unit configured to generate a feedback clock signal by delaying the delay clock signal for a predetermined time; a phase detecting unit configured to generate a phase detection signal by comparing a phase of the reference clock signal to a phase of the feedback clock signal; and a delay control unit configured to generate the single delay control signal and the dual delay control signal in response to the phase detection signal, and configured to selectively activate any one of the single delay control signal and the dual delay control signal according to an initial value of the phase detection signal.

In still another aspect, a delay locked loop (DLL) circuit comprises a delay line configured to generate a delay clock signal by delaying a reference clock signal in response to a delay control signal; a delay compensating unit configured to generate a feedback clock signal by delaying the delay clock signal for a predetermined time; a phase detecting unit configured to generate a phase detection signal by comparing a phase of the reference clock signal to a phase of the feedback clock signal; and a delay control unit configured to generate the delay control signal in response to the phase detection signal such that the delay control signal sets a delay value of the delay line to any one of a minimum value and an intermediate value, wherein the delay value is set according to an initial value of the phase detection signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
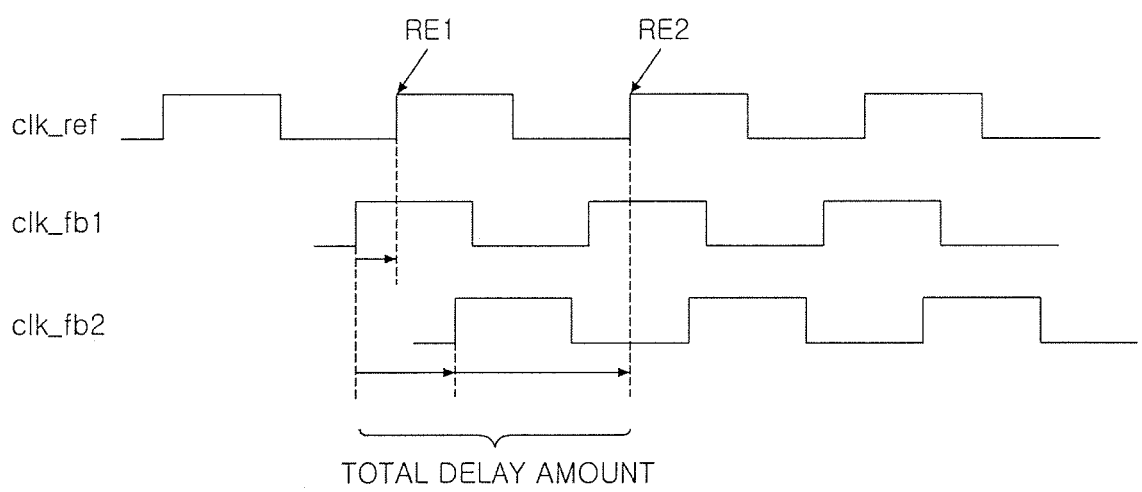
FIG. 1 is a timing diagram shown for illustrating the operation of a known DLL circuit.
Figure 2:
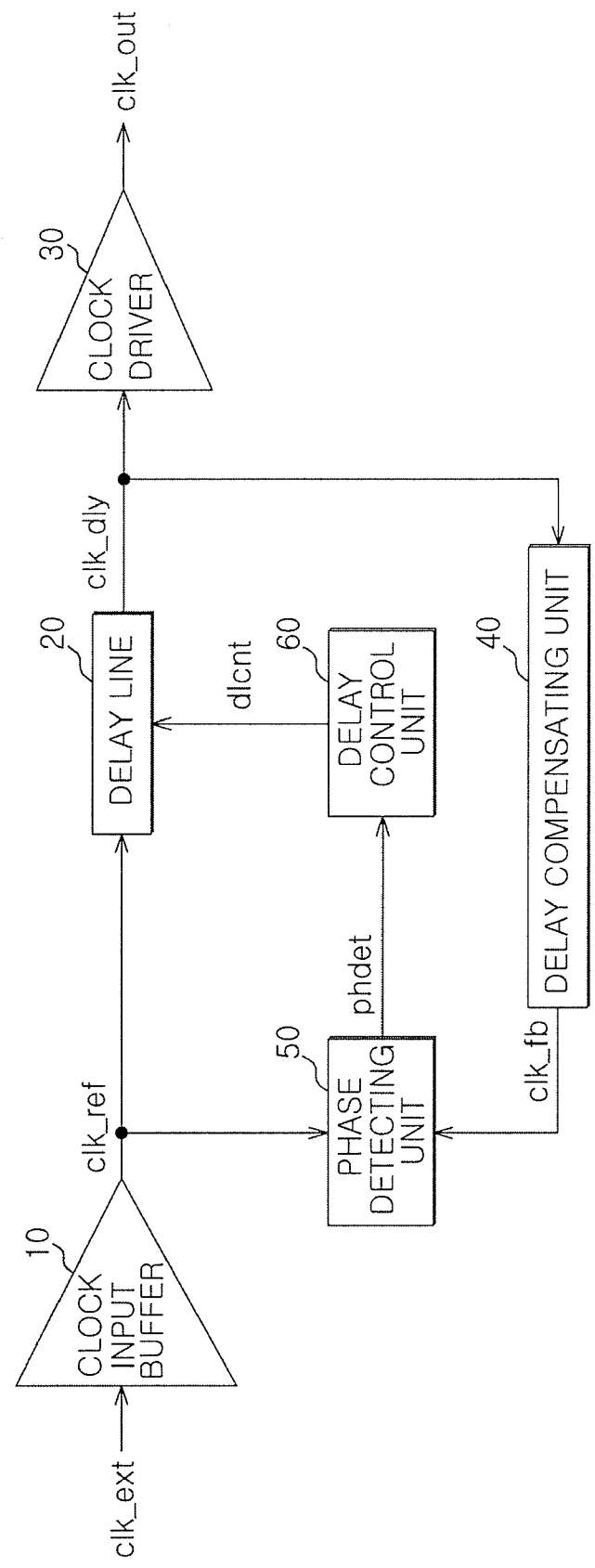
FIG. 2 is a schematic block diagram showing the configuration of an exemplary DLL circuit according to an embodiment of the present invention.

FIG. 2 is a schematic block diagram of the configuration of an exemplary DLL circuit according to an embodiment of the present invention.

As shown in FIG. 2, the DLL circuit according to an embodiment of the present invention includes a clock input buffer 10, a delay line 20, a clock driver 30, a delay compensating unit 40, a phase detecting unit 50, and a delay control unit 60.

The clock input buffer 10 generates a reference clock signal 'clk_ref' by buffering an external clock signal 'clk_ext'. The delay line 20 generates a delay clock signal 'clk_dly' by delaying the reference clock signal 'clk_ref' according to a delay control signal 'dlcnt'. The clock driver 30 generates an output clock signal 'clk_out' by driving the delay clock signal 'clk_dly'. The delay compensating unit 40 generates a feedback clock signal 'clk_fb' by delaying the delay clock signal 'clk_dly' for a predetermined time. The phase detecting unit 50 generates a phase detection signal 'phdet' by comparing the phase of the feedback clock signal 'clk_fb' to the phase of the reference clock signal 'clk_ref'. The delay control unit 60 generates the delay control signal 'dlcnt' in response to the phase detection signal 'phdet'.

Herein, the delay line 20 has a minimum delay value during initial operation. The delay line 20 can be set to the minimum delay value by setting the initial logic value of the delay control signal 'dlcnt', which in an embodiment of the present invention is implemented as a plurality of bits of digital code, accordingly.

As such, the feedback clock signal 'clk_fb' has a phase that is later than that of the reference clock signal 'clk_ref'. At the time of initial operation, the amount of delay in which the feedback clock signal 'clk_fb' is later than the reference clock signal 'clk_ref' represents the delay value of the delay compensating unit 40. Thereafter, the phase detecting unit 50 performs a phase comparing operation in which the phase of the reference clock signal 'clk_ref' is compared to the phase of the feedback clock signal 'clk_fb'. At this time, the phase detection signal 'phdet' output from the phase detecting unit 50 contains information on whether the phase of the feedback clock signal 'clk_fb' is earlier or later than that of the reference clock signal 'clk_ref' in the initial operation. The delay control unit 60 can then adjust the logic value of the delay control signal 'dlcnt' according to the phase detection signal 'phdet' containing the information as to whether the phase of the feedback clock signal 'clk_fb' is earlier or later than that of the reference clock signal 'clk_ref'.

The delay line 20 is configured to have two initial activation points that are activated depending upon the logical value of the delay control signal 'dlcnt' at this time, that is, in the initial operation. In general, the delay line is configured with a combination of a plurality of unit delayers that are connected in series. The unit delayers after any one unit delayer in the combination of the plurality of unit delayers are generally configured to be activated in the initial operation. Herein, the first unit delayer among the unit delayers activated in the initial operation is referred to as an initial activation point.

In the exemplary embodiment of the present invention, it is assumed that the delay line 20 has two initial activation points. However, the delay line may also be configured to have two or more activation points in accordance with the exemplary embodiment.

As such, the initial phase detection signal 'phdet' is generated according to the phase relationship between the reference clock signal 'clk_ref' and the initial feedback clock signal 'clk_fb', and the initial delay control signal 'dlcnt' has a logic value corresponding to the phase detection signal 'phdet' at this time (i.e., in the initial operation). The delay control unit 60 selects and activates any one of the two initial activation points of the delay line 20 in response to the phase detection signal 'phdet' generated in the initial operation.

For example, when the phase of the reference clock signal 'clk_ref' is earlier than the phase of the initial feedback clock signal 'clk_fb' (see, e.g., FIG. 4), the delay line 20 must allocate a comparatively large delay amount to the reference clock signal 'clk_ref' (i.e., a large delay amount when compared to the case in which the phase of the feedback clock signal 'clk_fb' is earlier than that of the reference clock signal 'clk_ref'). Therefore, the delay control unit 60 can select an activation point for activating a comparatively large number of unit delayers in accordance with the large delay amount among the unit delayers provided in the delay line 20 (i.e. a larger number of unit delayers when compared to the number of unit delayers when the signal 'clk_fb' is earlier than the phase of the reference clock signal 'clk_ref' as described below). Conversely, when the phase of the initial feedback clock signal 'clk_fb' is earlier than the phase of the reference clock signal 'clk_ref', the delay line 20 must allocate a comparatively small delay amount to the reference clock signal 'clk_ref'. Therefore, the delay control unit 60 can select an activation point for activating a comparatively small number of unit delayers among the unit delayers provided in the delay line 20 (i.e., a smaller number of unit delayers when compared to the number of unit delayers when the signal 'clk_ref' is earlier than the phase of the initial feedback clock signal 'clk_fb').

Figure 3:
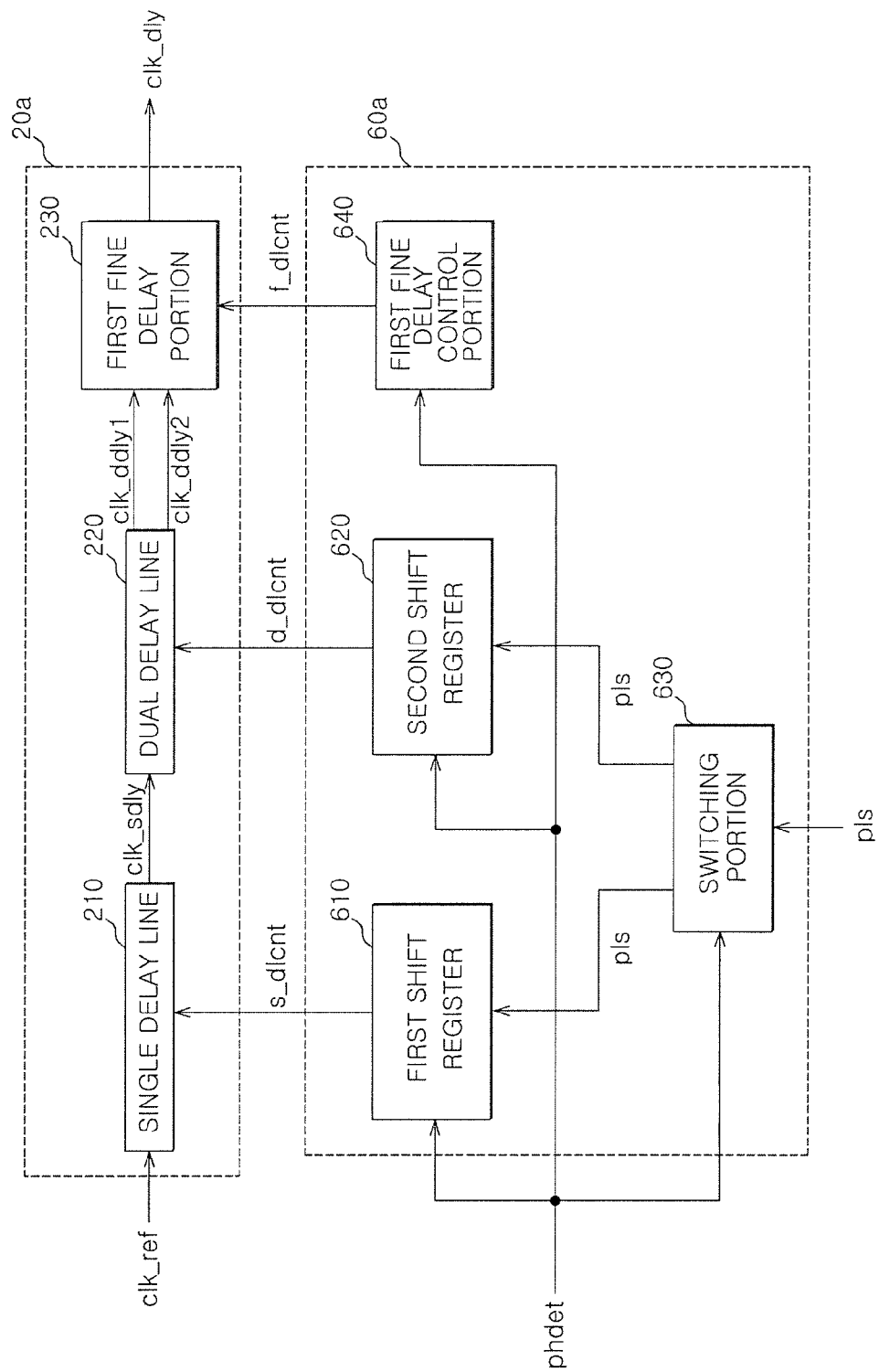
FIG. 3 is a first exemplary diagram showing the configuration of the delay line and the delay control unit of the exemplary DLL circuit of FIG. 2 according to an embodiment of the present invention.

FIG. 3 is a first exemplary diagram showing a configuration of the exemplary DLL circuit of FIG. 2 according to an embodiment of the present invention. For convenience of description, FIG. 3 illustrates only the configurations of the delay line 20 and the delay control unit 60. In the embodiment of the present invention shown in FIG. 3, the delay line 20a is implemented as a semi-dual delay line including a single delay line 210 and a dual delay line 220. Therefore, the delay control signal 'dlcnt' is implemented as a single delay control signal 's_dlcnt', a dual delay control signal 'd_dlcnt', and a fine delay control signal 'f_dlcnt'.

As shown in FIG. 3, the delay line 20a includes a single delay line 210, a dual delay line 220, and a first fine delay portion 230.

In the embodiment shown in FIG. 3, the single delay line 210 generates a single delay clock signal 'clk_sdly' by delaying the reference clock signal 'clk_ref' in response to the single delay control signal 's_dlcnt'. The dual-delay line 220 generates first and second dual delay clock signals 'clk_ddly1' and 'clk_ddly2' by delaying the single delay clock signal 'clk_sdly' in response to the dual delay control signal 'd_dlcnt'. Here, the phase of the first dual delay clock signal 'clk_ddly1' is not equal to the phase of the second dual delay clock signal 'clk_ddly2'. The first fine delay portion 230 generates the delay clock signal 'clk_dly' by mixing the phase of the first dual delay clock signal 'clk_ddly1' and the phase of the second dual delay clock signal 'clk_ddly2' in response to the fine delay control signal 'f_dlcnt'.

As such, the delay line 20a of the exemplary embodiment shown in FIG. 3 is implemented as the semi-dual delay line. By this configuration, the first fine delay portion 230 can perform a fine delay operation more efficiently. Herein, the dual delay line 220 is configured to support the fine delay operation. Generally, when the single delay line 210 is activated the dual delay line 220 is activated so as to increase or decrease the delay amount after the operation of the single delay line 210.

In the embodiment of the present invention shown in FIG. 3, the delay control unit 60a includes a first shift register 610, a second shift register 620, a switching portion 630, and a first fine delay control portion 640.

The first shift register 610 generates the single delay control signal 's_dlcnt' in response to a pulse signal 'pls' and the phase detection signal 'phdet'. The second shift register 620 generates the dual delay control signal 'd_dlcnt' in response to the pulse signal 'pls' and the phase detection signal 'phdet'. The switching portion 630 selectively provides the pulse signal 'pls' to the first shift register 610 or the second shift register 620 in response to the phase detection signal 'phdet'. The first fine delay control portion 640 generates the fine delay control signal 'f_dlcnt' in response to the phase detection signal 'phdet'.

Herein, the pulse signal 'pls', which is a signal generated from a clock generator, is toggled once for a predetermined number of cycles (for example, 20 cycles) of the reference clock signal 'clk_ref'.

As described above, the switching portion 630 is configured to selectively provide the pulse signal 'pls' to the first shift register 610 or the second shift register 620 in response to the phase detection signal 'phdet'. When the phase detection signal 'phdet' transmits information indicating that the phase of the reference clock signal 'clk_ref' is earlier than the phase of the feedback clock signal 'clk_fb', the switching portion 630 provides the pulse signal 'pls' to the first shift register 610. Conversely, when the phase detection signal 'phdet' transmits information indicating that the phase of the feedback clock signal 'clk_fb' is earlier than the phase of the reference clock signal 'clk_ref', the switching portion 630 provides the pulse signal 'pls' to the second shift register 620. Each of the first shift register 610 and the second shift register 620 is activated only when receiving the pulse signal 'pls'. At this time, the first shift register 610 and the second shift register 620 perform an operation to change the logic value of the single delay control signal 's_dlcnt' or a logic value of the dual delay control signal 'd_dlcnt' in response to the phase detection signal 'phdet'.

In the initial operation, the single delay control signal 's_dlcnt' and the dual delay control signal 'd_dlcnt' are set to values for minimizing delay amounts of the single delay line 210 and the dual delay line 220, respectively. Thereafter, the logic value of the single delay control signal 's_dlcnt' or the logic value of the dual delay control signal 'd_dlcnt' is changed depending on the initial value of the phase detection signal 'phdet'. When the phase of the reference clock signal 'clk_ref' is earlier than the phase of the initial feedback clock signal 'clk_fb', the logic value of the single delay control signal 's_dlcnt' is changed, such that the delay value of the single delay line 210 increases, whereby the phase of the feedback clock signal 'clk_fb' is gradually delayed. Thereafter, when the phase of the feedback clock signal 'clk_fb' becomes earlier than the phase of the reference clock signal 'clk_ref', the logic value of the dual delay control signal 'd_dlcnt' is changed, such that the delay value of the dual delay line 220 increases, whereby the phase of the feedback clock signal 'clk_fb' is continuously delayed. At this time, the phase of the feedback clock signal 'clk_fb' gets closer to the phase of the reference clock signal 'clk_ref', and once the phases are relatively close, the phases are made to coincide with each other by the fine delay operation of the first fine delay portion 230.

Conversely, when the phase of the initial feedback clock signal 'clk_fb' is earlier than the phase of the reference clock signal 'clk_ref', the logic value of the dual delay control signal 'd_dlcnt' is changed, such that the delay value of the dual delay control signal 'd_dlcnt' increases, whereby the phase of the feedback clock signal 'clk_fb' is delayed until it coincides with the phase of the reference clock signal 'clk_ref'.

The operation of the DLL circuit can be further understood by referring to the timing diagram shown in FIG. 4 and the description below.

Figure 4:
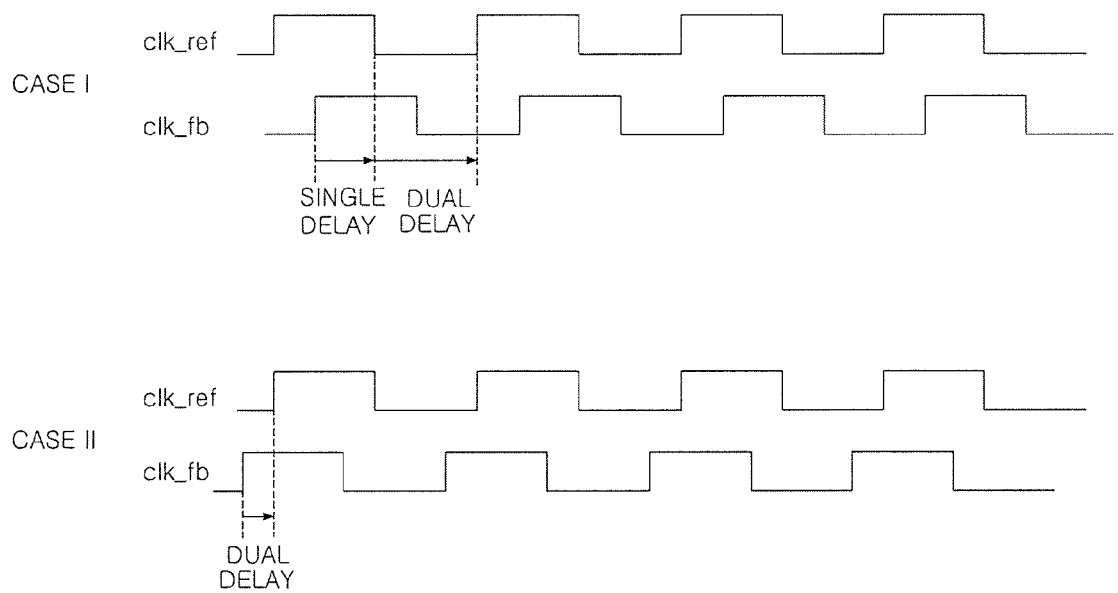
FIG. 4 is a timing diagram shown for illustrating the operation of the exemplary DLL circuit of FIG. 3 according to an embodiment of the present invention.

FIG. 4 illustrates a case (CASE I) in which the phase of the reference clock signal 'clk_ref' is earlier than the phase of the initial feedback clock signal 'clk_fb' and a case (CASE II) in which the phase of the initial feedback clock signal 'clk_fb' is earlier than the phase of the reference clock signal 'clk_ref'.

In the case (CASE I) in which the phase of the reference clock signal 'clk_ref' is earlier than the phase of the initial feedback clock signal 'clk_fb', a rising edge of the feedback clock signal 'clk-fb' is delayed by a single delay operation SINGLE DELAY of the single delay line 210 so as to be delayed until a falling edge of the reference clock signal 'clk_ref', and is delayed by a dual delay operation DUAL DELAY of the dual delay line 220 until the initial feedback clock signal 'clk_fb' coincides with a rising edge of the reference clock signal 'clk_ref'.

Conversely, in the case (CASE II) in which the phase of the initial feedback clock signal 'clk_fb' is earlier than the phase of the reference clock signal 'clk_ref', the rising edge of the feedback clock signal 'clk_fb' is delayed by the dual delay operation DUAL DELAY of the dual delay line 220 until the initial feedback clock signal 'clk_fb' coincides with the rising edge of the reference clock signal 'clk_ref'.

As such, the delay line 20 has an activation point in each of the single delay line 210 and the dual delay line 220. By this configuration, the total delay amount of the delay line 20 does not have to exceed one cycle of the reference clock signal 'clk_ref'. Accordingly, the DLL circuit according to an embodiment of the present invention can reduce its occupancy area and suppress generation of internal jitter.

In the exemplary embodiment shown in FIG. 3, the DLL circuit may also include a clock divider configured to divide the frequency of the initial feedback clock signal 'clk_fb' into two and to transmit the divided frequencies to the phase detecting unit 50. The phase detecting unit 50 may be configured to initialize the operation of the delay control unit 60 in response to the divided initial feedback clock signal 'clk_b'. Such a change in circuit design can easily be performed by those skilled in the art and detailed description thereof will be omitted for convenience of description.

Figure 5:
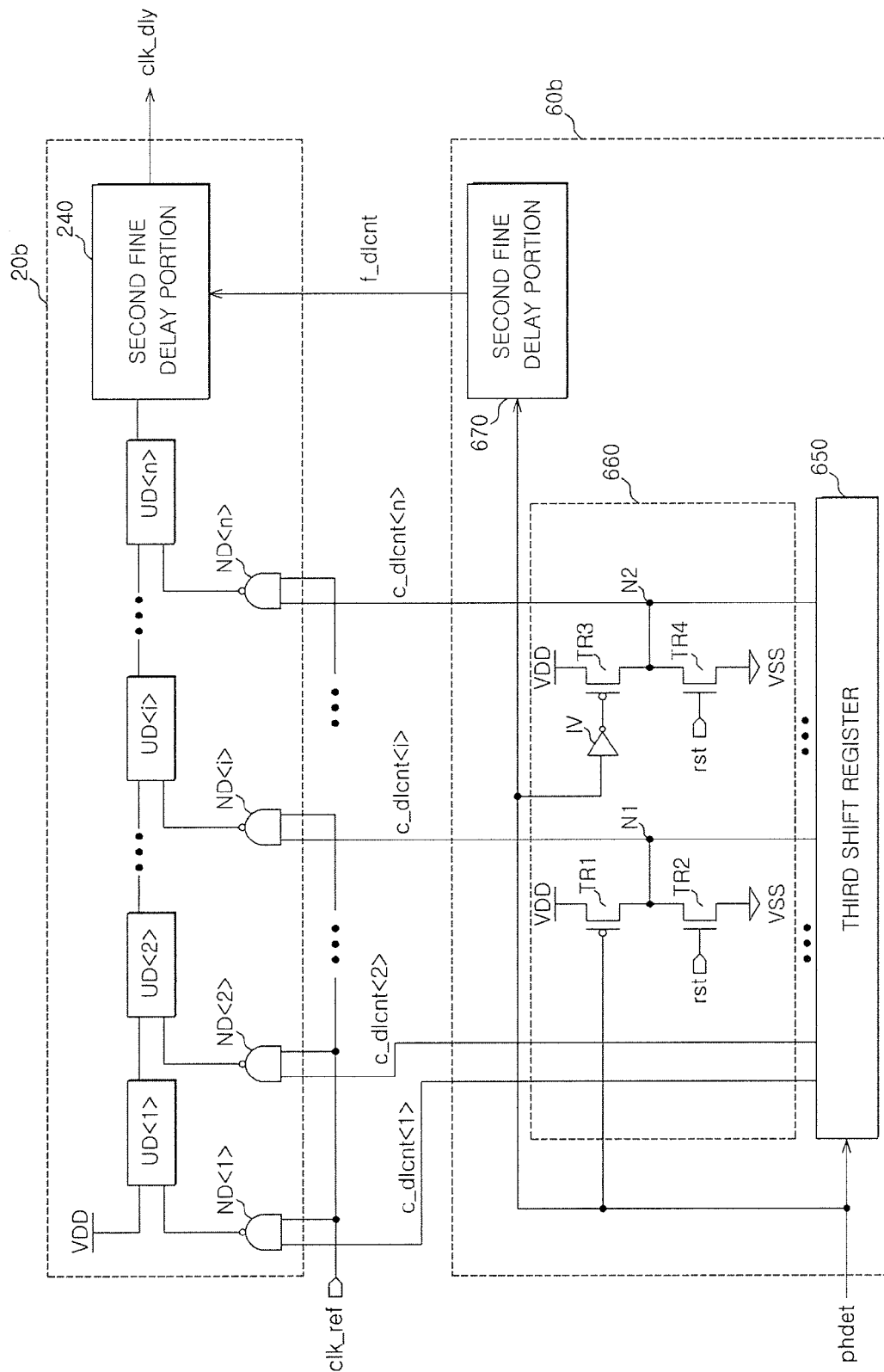
FIG. 5 is a second exemplary diagram showing the configuration of the delay line and the delay control unit of the exemplary DLL circuit of FIG. 2 according to an embodiment of the present invention.

FIG. 5 is a second exemplary diagram for showing a configuration of the exemplary DLL circuit of FIG. 2 according to an embodiment of the present invention. For convenience of description, FIG. 5 illustrates only the configurations of the delay line 20b and the delay control unit 60b. Herein, it is assumed that the delay control signal 'dlcnt' is implemented as a coarse delay control signal 'c_dlcnt<1:n>', which is an n-bit digital code, and a fine delay control signal 'f_dlcnt'.

As shown in FIG. 5, the delay line 20b is configured to include n NAND gates 'ND<1:n>', n unit delayers 'UD<1:n>', and a second fine delay portion 240.

Each of the n NAND gates 'ND<1:n>' receives a corresponding bit of the coarse delay control signal 'c_dlcnt<1:n>' and the reference clock signal 'clk_ref'. The n unit delayers 'UD<1:n>' are connected to each other in series, the n unit delayers 'UD<1:n>' receive output signals of the n NAND gates 'ND<1:n>', respectively, and each of the n unit delayers 'UD<1:n>' receives the output signal of the previous n unit delayer. A first unit delayer 'UD<1>' among the n unit delayers 'UD<1:n>' receives an external supply voltage VDD as an input signal thereof. The second fine delay portion 240 generates the delay clock signal 'clk_dly' by delaying an output signal of the n-th unit delayer 'UD<n>' in response to the fine delay control signal 'f_dlcnt'.

Meanwhile, the delay control unit 60b includes a third shift register 650, an initial activation setting portion 660, and a second fine delay control portion 670.

The third shift register 650 generates the n-bits of the coarse delay control signal 'c_dlcnt<1:n>' in response to the phase detection signal 'phdet'. The initial activation setting portion 660 controls the logic value of an i-th bit 'c_dlcnt<i>' and the logic value of the n-th bit 'c_dlcnt<n>' among the n bits of the coarse delay control signal 'c_dlcnt<1:n>' in response to a reset signal 'rst' and the phase detection signal 'phdet'. The second fine delay control portion 670 generates the fine delay control signal 'f_dlcnt' in response to the phase detection signal 'phdet'.

In the embodiment of the present invention shown in FIG. 5, the initial activation setting portion 660 includes first and second nodes N1 and N2, an inverter IV, and first to fourth transistors TR1 to TR4.

The first node N1 is connected to a transmission line of the i-th bit of the coarse delay control signal 'c_dlcnt<i>'. The first transistor TR1 includes a gate that receives the phase detection signal 'phdet', a source to which the external supply voltage VDD is applied, and a drain that is connected to the first node N1. The second transistor TR2 includes a gate that receives the reset signal 'rst', a drain that is connected to the first node N1, and a source that is grounded.

The second node N2 is connected to a transmission line of the n-th bit of the coarse delay control signal 'c_dlcnt<n>'. The inverter IV receives the phase detection signal 'phdet'. The third transistor TR3 includes a gate that receives an output signal of the inverter IV, a source to which the external supply voltage VDD is applied, and a drain that is connected to the second node N2. The fourth transistor TR4 includes a gate that receives the reset signal 'rst', a drain that is connected to the second node N2, and a source that is grounded.

In the embodiment of present invention shown in FIG. 5, only one bit among the n bits of the coarse delay control signal 'c_dlcnt<1:n>' can have a logic value of '1'. The third shift register 650 sets the logic value of the n-th bit 'c_dlcnt<n>' of the coarse delay control signal to a logic level '1' in an initial operation thereof to minimize the total delay amount of the delay line 20b. The reset signal 'rst' is enabled after the delay clock signal 'clk_dly' is generated, such that logic values of all bits of the n-bit coarse delay control signal 'c_dlcnt<1:n>' are set to '0'.

Thereafter, the initial activation setting portion 660 performs an operation to activate the i-th bit of the coarse delay control signal 'c_dlcnt<i>' or the n-th bit of the coarse delay control signal 'c_dlcnt<n>' depending on the logical value of the phase detection signal 'phdet'. Further, at this time, the n-bit of the coarse delay control signal 'c_dlcnt<1:n>' is latched, a logic value of the latched n-bit of the coarse delay control signal 'c_dlcnt<1:n>' is set as a reference value, and a shifting operation corresponding to the phase detection signal 'phdet' is performed. For reference, i indicates any one natural number between 1 and n except for 1 and n.

Herein, the initial activation setting portion 660 sets the logic value of the i-th bit 'c_dlcnt<i>' of the coarse delay control signal 'c_dlcnt<1:n>' to '1' when the voltage level of the phase detection signal 'phdet' is at a low. The phase detection signal 'phdet' is at a low when the phase of the initial feedback clock signal 'clk_fb' is earlier than the phase of the reference clock signal 'clk_ref'. Conversely, the initial activation setting portion 660 sets the logic value of the n-th bit c_dlcnt<n> of the coarse delay control signal 'c_dlcnt<1:n>' to '1' when the voltage level of the phase detection signal 'phdet' is at a high. The phase detection signal 'phdet' is at a high when the phase of the reference clock signal 'clk_ref' is earlier than the phase of the initial feedback clock signal 'clk_fb'.

Thus, when a comparatively large delay amount is required for the initial feedback clock signal 'clk_fb' (such as, when the phase of the reference clock signal 'clk_ref' is earlier than the phase of the initial feedback clock signal 'clk_fb'), the delay control unit 60b activates the n-th bit of the coarse delay control signal 'c_dlcnt<n>' to gradually increase the delay value of the delay line 20b from a minimum value. Conversely, when a comparatively small delay amount is required for the initial feedback clock signal 'clk_fb' (such as, when the phase of the feedback clock signal 'clk_fb' is earlier than the phase of the initial feedback clock signal 'clk_fb'), the delay control unit 60b activates the i-th bit of the coarse delay control signal 'c_dlcnt<i>' to gradually increase the delay value of the delay line 20b from an intermediate value.

In the exemplary embodiment shown in FIG. 5, as the jitter component is included in the feedback clock signal 'clk_fb', an abnormal delay phenomenon occurs, such that the delay control unit 60b and the delay line 20b operate in the above-mentioned manner to reduce the delay amount. In a state in which the i-th bit of the coarse delay control signal 'c_dlcnt<i>' is activated, it is possible to reduce the delay amount with respect to the feedback clock signal 'clk_fb'. In this case, although the total delay amount of the delay line 20b increases in comparison with the previous embodiment, the total delay amount does not exceed 1.5 cycles as a result of including two activation points and selectively activating one of the two activation points. Accordingly, it is possible to reduce an occupancy area when compared to the related art.

Herein, the intermediate delay value of the delay line 20b indicates a predetermined value between the minimum value and the maximum value of the delay line. This value must be set by considering the jitter characteristic, the unit delay value, the frequency characteristic, etc. of the DLL circuit. The intermediate value of the delay line 20b is realized by setting the i-th bit of the coarse delay control signal 'c_dlcnt<i>'.

As described above, a DLL circuit is configured to have two or more initial activation points on a delay line and select an initial activation point depending on the phase relationship between a reference clock signal and an initial feedback clock signal. As a result, the length of the delay line may be shorter than that of the related art regardless of the phase states of the reference clock signal and the initial feedback clock signal. Further, in some cases, the DLL circuit may have a configuration for preventing the generation of a jitter component. As such, the DLL circuit has advantages of improving area efficiency and reducing the generation of the jitter component by decreasing the length of the delay line when compared to the related art.

While certain embodiments have been described above, it will be understood to those skilled in the art that the embodiments described are by way of example only. Accordingly, the apparatus described herein should not be limited based on the described embodiments. Rather, the apparatus described herein should only be limited in light of the claims that follow when taken in conjunction with the above description and accompanying drawings.

What is claimed is:

1. A delay locked loop circuit, comprising:
a delay line configured to generate a delay clock signal by delaying a reference clock signal in response to a delay control signal, the delay line having two or more initial activation points, wherein the initial activation points are selected according to an initial value of the delay control signal;
a delay compensating unit configured to generate a feedback clock signal by delaying the delay clock signal for a predetermined time;
a phase detecting unit configured to generate a phase detection signal by comparing a phase of the reference clock signal to a phase of the feedback clock signal; and
a delay control unit configured to generate the delay control signal in response to the phase detection signal,
the phase detecting unit generates and transmits the initial phase detection signal by comparing the reference clock signal to the feedback clock signal generated when the reference clock signal is delayed by the delay line set to the minimum initial delay value, and
the delay control unit is configured to select and activate any one of the two or more initial activation points of the delay line in response to the initial phase detection signal generated by comparing the reference clock signal to the feedback clock signal generated by the minimum initial delay value, wherein the two or more activation points include a first activation point and a second activation point, and the delay control unit is configured to select the first activation point when the initial phase detection signal indicates a first degree of delay and is configured to select the second activation point when the initial phase detection signal indicates a second degree of delay less than the first degree of delay.

2. The DLL circuit of claim 1, wherein:
when the phase detection signal generated by the phase detecting unit includes information indicating that a phase of the reference clock signal is earlier than a phase of the initial feedback clock signal, the delay control unit selects an activation point in which the number of unit delayers for activating is more when compared to the number of unit delayers for activating when the phase detection signal includes information indicating that the phase of the initial feedback clock signal is earlier than the phase of the reference clock signal.

3. A delay locked loop circuit, comprising:
a delay line configured to generate a delay clock signal by delaying a reference clock signal in response to a single delay control signal and a dual delay control signal;
a delay compensating unit configured to generate a feedback clock signal by delaying the delay clock signal for a predetermined time;
a phase detecting unit configured to generate a phase detection signal by comparing a phase of the reference clock signal to a phase of the feedback clock signal; and
a delay control unit configured to generate the single delay control signal and the dual delay control signal in response to the phase detection signal, and configured to selectively activate any one of the single delay control signal and the dual delay control signal according to an initial value of the phase detection signal.

4. The DLL circuit of claim 3, wherein the delay line comprises:
a single delay line configured to generate a single delay clock signal by delaying the reference clock signal in response to the single delay control signal; and
a dual delay line configured to delay the single delay clock signal in response to the dual delay control signal.

5. The DLL circuit of claim 4, wherein the delay control unit is configured to set values of the single delay control signal and the dual delay control signal to minimum delay values of the single delay line and the dual delay line, respectively, in an initial operation.

6. The DLL circuit of claim 5, wherein the delay control unit is configured to change a logic value of the single delay control signal when the initial value of the phase detection signal generated by the phase detecting unit includes information indicating that a phase of the reference clock signal is earlier than a phase of the initial feedback clock signal, and configured to change a logic value of the dual delay control signal when the phase detection signal generated by the phase detecting unit includes information indicating that the phase of the feedback clock signal is earlier than the phase of the reference clock signal.

7. The DLL circuit of claim 6, wherein the delay control unit is configured to change the logic value of the dual delay control signal when the initial value of the phase detection signal generated by the phase detecting unit includes information indicating that the phase of the initial feedback clock signal, which is generated when the values of the single delay control signal and the dual delay control signal are set to minimum delay values, is earlier than the phase of the reference clock signal.

8. The DLL circuit of claim 7, wherein the delay control unit comprises:
a first shift register configured to generate the single delay control signal in response to a pulse signal and the phase detection signal;
a second shift register configured to generate the dual delay control signal in response to the pulse signal and the phase detection signal; and
a switching portion configured to selectively provide the pulse signal to any one of the first shift register and the second shift register, and the pulse signal is selectively provided according to the phase detection signal.

9. The DLL circuit of claim 8, wherein:
the delay line further comprises a fine delay portion configured to generate the delay clock signal by delaying a clock signal output from the dual delay line in response to a fine delay control signal, and
the delay control unit further comprises a fine delay control portion configured to generate the fine delay control signal in response to the phase detection signal.

* * * * *